United States Patent
Arahara

(10) Patent No.: US 10,042,266 B2
(45) Date of Patent: Aug. 7, 2018

(54) DETERMINATION METHOD, EXPOSURE APPARATUS, STORAGE MEDIUM, AND METHOD OF MANUFACTURING ARTICLE

(71) Applicant: CANON KABUSHIKI KAISHA, Tokyo (JP)

(72) Inventor: Koshiro Arahara, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 2 days.

(21) Appl. No.: 15/233,166

(22) Filed: Aug. 10, 2016

(65) Prior Publication Data
US 2017/0052457 A1    Feb. 23, 2017

(30) Foreign Application Priority Data
Aug. 20, 2015    (JP) .................................. 2015-163092

(51) Int. Cl.
| | |
|---|---|
| G03B 27/32 | (2006.01) |
| G03B 27/52 | (2006.01) |
| G03B 27/54 | (2006.01) |
| G03B 27/74 | (2006.01) |
| G03F 7/20 | (2006.01) |

(52) U.S. Cl.
CPC .............. *G03F 7/705* (2013.01); *G03F 7/20* (2013.01); *G03F 7/706* (2013.01); *G03F 7/70125* (2013.01); *G03F 7/70891* (2013.01)

(58) Field of Classification Search
CPC ........ G03F 7/20; G03F 7/70125; G03F 7/705; G03F 7/706; G03F 7/70891
USPC .................................. 355/30, 52, 67, 68, 77
See application file for complete search history.

(56) References Cited

U.S. PATENT DOCUMENTS
2013/0342819 A1* 12/2013 Takeshita ............ G03F 7/70141
355/67

FOREIGN PATENT DOCUMENTS
| JP | S63-058349 A | 3/1988 |
|---|---|---|
| JP | 2001160533 A | 6/2001 |

* cited by examiner

*Primary Examiner* — Colin Kreutzer
(74) *Attorney, Agent, or Firm* — Rossi, Kimms & McDowell LLP

(57) ABSTRACT

The present invention provides a determination method of determining a first prediction formula for predicting a fluctuation in optical characteristics of a projection optical system while a substrate is exposed on a first exposure condition, the method comprising obtaining a correlation coefficient between the first exposure condition and a second exposure condition corresponding to a second prediction formula for predicting the fluctuation in the optical characteristics, determining, when the correlation coefficient falls within an allowable range, the first prediction formula based on the second prediction formula without actually measuring the fluctuation in the optical characteristics, and determining, when the correlation coefficient falls outside the allowable range, the first prediction formula based on a result of actually measuring the fluctuation in the optical characteristics.

18 Claims, 6 Drawing Sheets

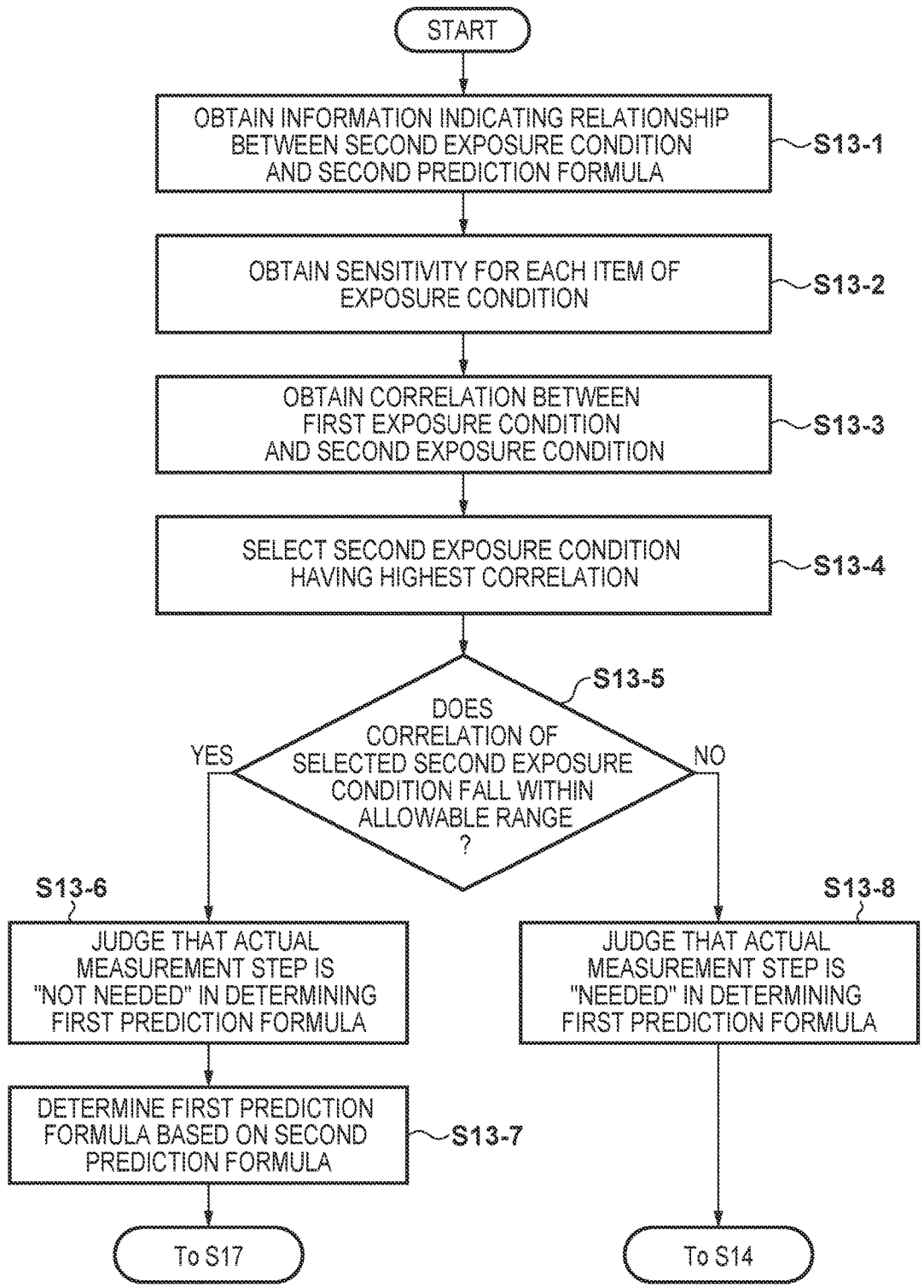

FIG. 6

| | | ILLUMINATION NA | ILLUMINATION σ | WIDTH OF ANGLE OF VIEW [mm] | HEIGHT OF ANGLE OF VIEW [mm] | Ic |
|---|---|---|---|---|---|---|
| FIRST EXPOSURE CONDITION | | 0.6 | 0.5 | 20 | 30 | ? |
| SECOND EXPOSURE CONDITION | CONDITION 1 | 0.6 | 0.7 | 24 | 30 | 1.07 |
| | CONDITION 2 | 0.5 | 0.6 | 25 | 29 | 1.03 |
| | CONDITION 3 | 0.4 | 0.7 | 20 | 28 | -0.15 |
| | CONDITION 4 | 0.5 | 0.5 | 23 | 25 | -0.20 |
| | CONDITION 5 | 0.6 | 0.7 | 24 | 27 | 0.47 |
| | CONDITION 6 | 0.5 | 0.3 | 23 | 29 | 0.54 | ined
DETERMINATION METHOD, EXPOSURE APPARATUS, STORAGE MEDIUM, AND METHOD OF MANUFACTURING ARTICLE

BACKGROUND OF THE INVENTION

Field of the Invention

The present invention relates to a determination method of determining a prediction formula for predicting a fluctuation in optical characteristics of a projection optical system, an exposure apparatus, a storage medium, and a method of manufacturing an article.

Description of the Related Art

As one of apparatuses used in the manufacturing step (lithography step) of semiconductor devices and the like, there is an exposure apparatus which exposes a substrate via a projection optical system and transfers a pattern of an original to a shot region on the substrate. In such an exposure apparatus, a part of exposure light is absorbed in the projection optical system, and thus optical characteristics of the projection optical system may fluctuate under the influence of heat generated by the absorption. As a result, it may become difficult to transfer the pattern of the original to the shot region accurately.

Japanese Patent Laid-Open No. 2001-160533 proposes a method of predicting a fluctuation in optical characteristics of a projection optical system by using a prediction formula having an exposure amount, an exposure period (exposure time), and the like as variables and controlling the optical characteristics of the projection optical system based on a predicted value. Japanese Patent Laid-Open No. 63-58349 proposes a method of determining a prediction formula based on a result obtained by actually measuring a fluctuation in optical characteristics of a projection optical system so as to reduce errors generated in a predicted value.

In the projection optical system, a tendency of the fluctuation in the optical characteristics may change for each exposure condition for exposing the substrate. Therefore, the prediction formula may be determined for each exposure condition. However, actually measuring the fluctuation in the optical characteristics as described in Japanese Patent Laid-Open No. 63-58349 each time the exposure condition is changed may be a cause of preventing an increase in throughput.

SUMMARY OF THE INVENTION

The present invention provides, for example, a technique advantageous in increasing throughput of an exposure apparatus.

According to one aspect of the present invention, there is provided a determination method of determining a first prediction formula for predicting a fluctuation in optical characteristics of a projection optical system while a substrate is exposed on a first exposure condition, the method comprising: obtaining a correlation coefficient between the first exposure condition and a second exposure condition corresponding to a second prediction formula for predicting the fluctuation in the optical characteristics; determining, when the correlation coefficient falls within an allowable range, the first prediction formula based on the second prediction formula without actually measuring the fluctuation in the optical characteristics while the substrate is exposed on the first exposure condition; and determining, when the correlation coefficient falls outside the allowable range, the first prediction formula based on a result of actually measuring the fluctuation in the optical characteristics while the substrate is exposed on the first exposure condition.

Further features of the present invention will become apparent from the following description of exemplary embodiments with reference to the attached drawings.

BRIEF DESCRIPTION OF THE DRAWINGS

FIG. 5 is a flowchart showing a method of judging whether an actual measurement step is needed when determining the first prediction formula;

FIG. 6 is a table showing an example of information indicating the relationship between coefficients of the second prediction formula and the second exposure conditions corresponding to them.

DESCRIPTION OF THE EMBODIMENTS

Figure 1:
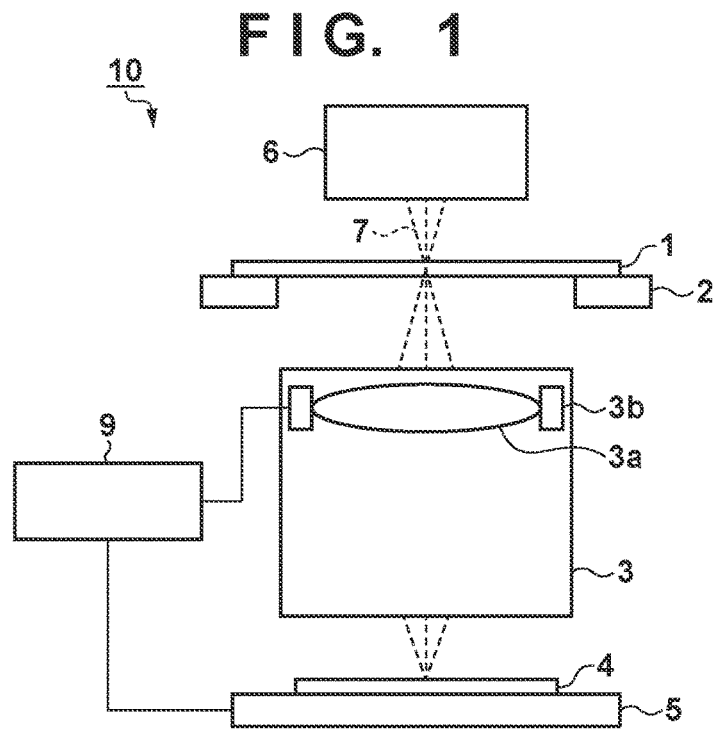
FIG. 1 is a schematic view showing an exposure apparatus according to the first embodiment.

Exemplary embodiments of the present invention will be described below with reference to the accompanying drawings. Note that the same reference numerals denote the same members throughout the drawings, and a repetitive description thereof will not be given.

First Embodiment

An exposure apparatus 10 according to the first embodiment of the present invention will be described with reference to FIG. 1. FIG. 1 is a schematic view showing the exposure apparatus 10 according to the first embodiment. The exposure apparatus 10 can include, for example, an original stage 2 which holds an original 1, a projection optical system 3, a substrate stage 5 that can move while holding a substrate 4, an illumination optical system 6, and a control unit 9. The control unit 9 includes, for example, a CPU and a memory, and controls a process of transferring a pattern of the original 1 to a shot region on the substrate 4 (controls the respective units of the exposure apparatus 10).

The illumination optical system 6 shapes light emitted from a light source (not shown) by using a light-shielding member such as a masking blade included in the system and illuminates a pattern region (a region where a pattern has been formed) of the original 1 with the shaped light. The original 1 and the substrate 4 are held by the original stage 2 and the substrate stage 5, respectively, and are located at optically almost conjugate positions (object plane and image plane of the projection optical system 3) via the projection optical system 3. The projection optical system 3 projects the pattern of the original 1 onto the substrate 4 (shot region).

Figure 2A:
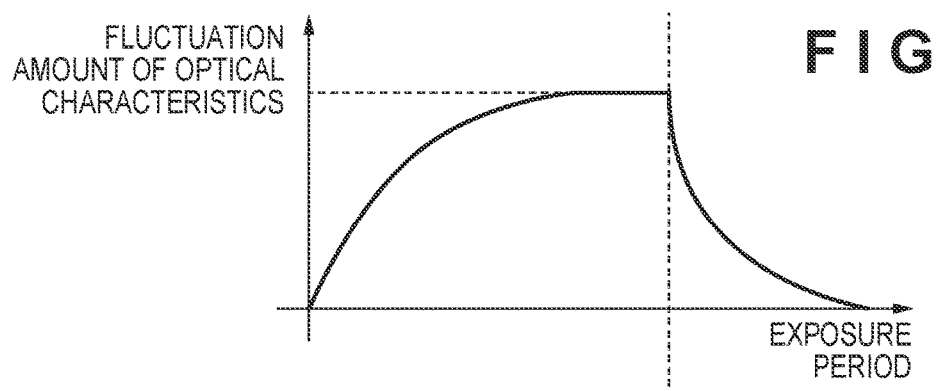
FIG. 2A is a graph showing the relationship between an exposure period and a fluctuation amount of optical characteristics.
Figure 2B:
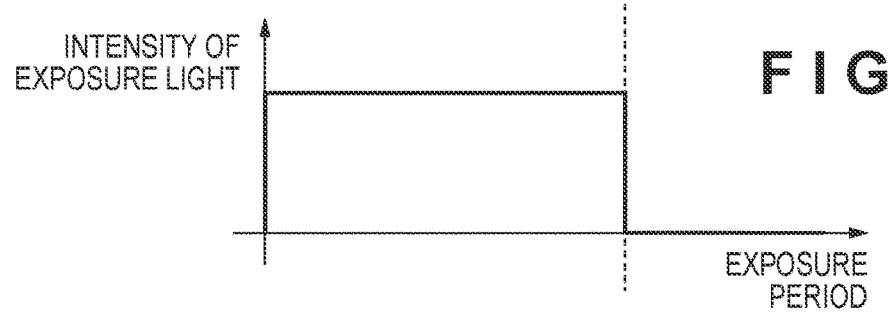
FIG. 2B is a graph showing the relationship between the exposure period and an intensity of exposure light.

In the exposure apparatus 10 thus configured, a part of exposure light 7 is absorbed in the projection optical system 3, and thus optical characteristics (for example, a projection magnification and a distortion) of the projection optical system 3 may fluctuate over an exposure period under the influence of heat generated by the absorption. For example, as shown in FIG. 2B, the optical characteristics of the projection optical system 3 exponentially fluctuate as shown in FIG. 2A when an exposure process is performed with the exposure light 7 having a predetermined intensity. It may thus become difficult to transfer the pattern of the original 1 to shot region accurately. Therefore, in the exposure apparatus 10, a predicted value for the fluctuation in the optical characteristics of the projection optical system 3 relative to the exposure period may be obtained by a prediction formula, and the exposure process may be performed while controlling, based on the predicted value, a change unit which changes the optical characteristics of the projection optical system 3. Note that the change unit can include, for example, at least one of a driving unit 3b which drives an optical element 3a of the projection optical system 3 and the substrate stage 5. In the first embodiment, an example will be described in which the driving unit 3b is used as the change unit and is controlled based on a predicted value obtained by a prediction formula. The driving unit 3b shown in FIG. 1 is configured to drive one optical element 3a. However, the present invention is not limited to this. The driving unit 3b may be configured to drive a plurality of optical elements.

A predicted value $\Phi_k$ of the fluctuation in the optical characteristics of the projection optical system 3 can be obtained by, for example, a prediction formula given by:

$$\Phi_k = Ic \cdot E_k - (Ic \cdot E_k - \Phi_{k-1}) \exp(-t_k/K) \tag{1}$$

where $E_k$ represents an exposure amount, $t_k$ represents an exposure period, Ic represents a coefficient for making the predicted value closer to an actually measured value (a coefficient for correcting an error in the predicted value with respect to the actually measured value), and K represents a time constant related to heat conduction of the projection optical system 3. In the first embodiment, the coefficient Ic and the time constant K in formula (1) are parameters determined to optimize the prediction formula, and can be determined for each type of the optical characteristics (for example, the projection magnification, focus, distortion, and the like) of the projection optical system 3. The parameters will be referred to as correction parameters hereinafter.

Errors with respect to the actually measured value may be generated in the predicted value $\Phi_k$ obtained by the prediction formula. If the errors with respect to the actually measured value are generated in the predicted value $\Phi_k$, it may become difficult to transfer the pattern of the original 1 to the shot region on the substrate 4 accurately even if the change unit (driving unit 3b) is controlled in accordance with the predicted value $\Phi_k$. Therefore, the prediction formula (correction parameters) may be determined such that the fluctuation in the optical characteristics of the projection optical system 3 while the substrate 4 is exposed is actually measured, and the predicted value $\Phi_k$ approaches the actually measured value based on that result.

Note that the fluctuation in the optical characteristics of the projection optical system 3 (to be simply referred to as the "optical characteristics" hereinafter) generally depends on an exposure condition which includes a plurality of items such as illumination NA, illumination σ, an exposure angle of view, the transmittance of light in the original, the reflectance of light in the substrate, and the like. For example, if an illumination condition determined by the illumination NA and the illumination σ changes, a light intensity distribution formed on a pupil plane of the projection optical system 3 changes. On the other hand, if the exposure angle of view changes, light intensity distributions formed near an object plane and an image plane of the projection optical system 3 change. If the light intensity distributions on the pupil plane, object plane, and image plane of the projection optical system 3 change as described above, a temperature distribution in the optical element 3a (lens) of the projection optical system 3 changes. As a result, the optical element 3a may deform, and its refractive index may be changed, causing the fluctuation in the optical characteristics. Therefore, the prediction formula (correction parameters) may be determined for each exposure condition in the exposure apparatus 10.

However, performing an actual measurement step of actually measuring the fluctuation in the optical characteristics while the substrate 4 is exposed each time the exposure condition is changed may be a cause of preventing an increase in throughput. That is, the actual measurement step may be omitted as much as possible when determining the prediction formula. To achieve this, the exposure apparatus 10 of the first embodiment obtains a correlation coefficient (correlation or correlativity) between the first exposure condition and the second exposure condition corresponding to the second prediction formula for predicting the optical characteristics when the first prediction formula for predicting the fluctuation in the optical characteristics during exposure on the first exposure condition is determined. The second prediction formula is a formula for predicting the fluctuation in the optical characteristics while the substrate 4 is exposed on the second exposure condition, and is determined in advance by undergoing the actual measurement step on the second exposure condition before a step of obtaining the correlation coefficient between the first exposure condition and the second exposure condition. Then, the exposure apparatus 10 determines the first prediction formula based on the second prediction formula when the obtained correlation coefficient falls within an allowable range. This makes it possible to omit the actual measurement step on the first exposure condition.

[Method of Determining First Prediction Formula]

Figure 3:
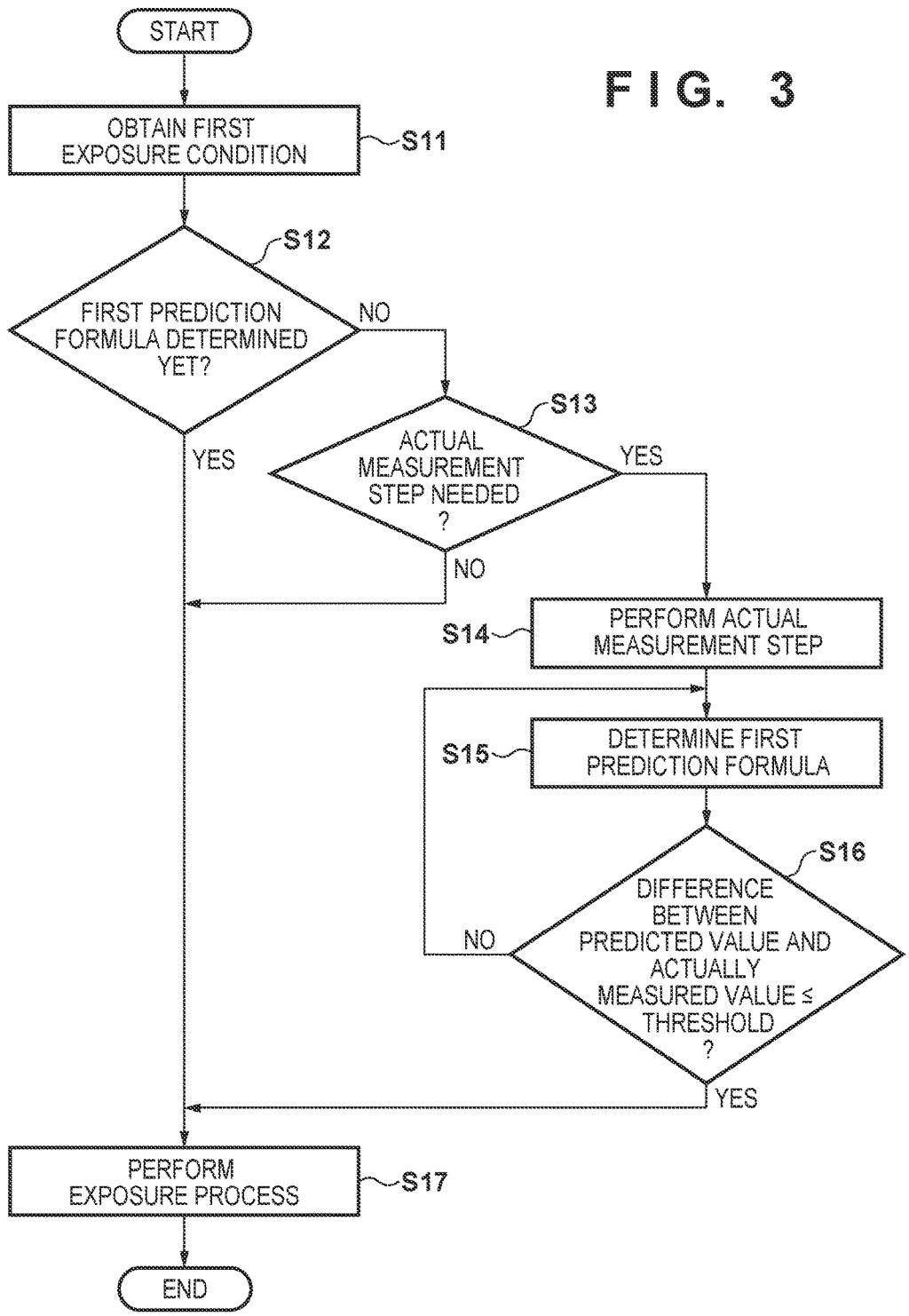
FIG. 3 is a flowchart showing a method of determining a prediction formula.

A method of determining the prediction formula used in the exposure process of the substrate 4 will now be described with reference to FIG. 3. FIG. 3 is a flowchart showing the method of determining the prediction formula used in the exposure process. An example will be described here in which the control unit 9 of the exposure apparatus 10 determines the prediction formula. However, the present invention is not limited to this. For example, a computer outside the exposure apparatus 10 may determine the prediction formula.

In step S11, the control unit 9 obtains an exposure condition (first exposure condition) in the exposure process of the substrate 4. As described above, the exposure condition can include items such as the illumination NA, the illumination σ, the exposure angle of view, the transmittance of light in the original 1, the reflectance of light in the substrate 4, and the like. In step S12, the control unit 9 judges whether the first prediction formula corresponding to the first exposure condition has already been determined. If the control unit 9 judges that the first prediction formula has already been determined, the process advances to step S17. If the control unit 9 judges that the first prediction formula has not been determined yet, the process advances to step S13. In step S13, the control unit 9 judges whether the actual measurement step is needed when the first prediction formula (coefficient Ic) corresponding to the first exposure condition is determined. If the control unit 9 judges that the actual measurement step is needed (Yes in step S13), the process advances to step S14. If the control unit 9 judges that the actual measurement step is not needed (No in step S13), the process advances to step S17. A detail of step S13 will be described later.

In step S14, the control unit 9 performs the actual measurement step of actually measuring the fluctuation in the optical characteristics on the first exposure condition. In the actual measurement step, the substrate 4 is exposed on the first exposure condition in practice, and the fluctuation in the optical characteristics during that exposure is measured. As a method of measuring the fluctuation in the optical characteristics during exposure, for example, a pattern capable of evaluating the fluctuation in the optical characteristics may be transferred onto the substrate by using the original 1 having the pattern, and the fluctuation in the optical characteristics may be measured based on that transfer result. Alternatively, a detection unit which detects the fluctuation in the optical characteristics may be provided in the exposure apparatus, and the fluctuation in the optical characteristics may be measured based on a result of a detection by the detection unit.

Figure 4A:
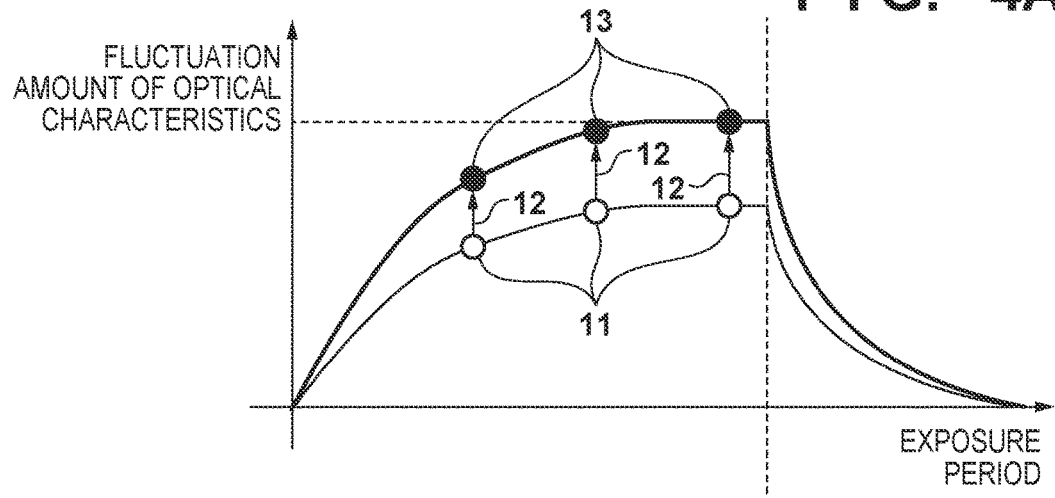
FIG. 4A is a graph showing actually measured values of a fluctuation in optical characteristics on the first exposure condition and predicted values of the fluctuation in the optical characteristics obtained by the second prediction formula.
Figure 4B:
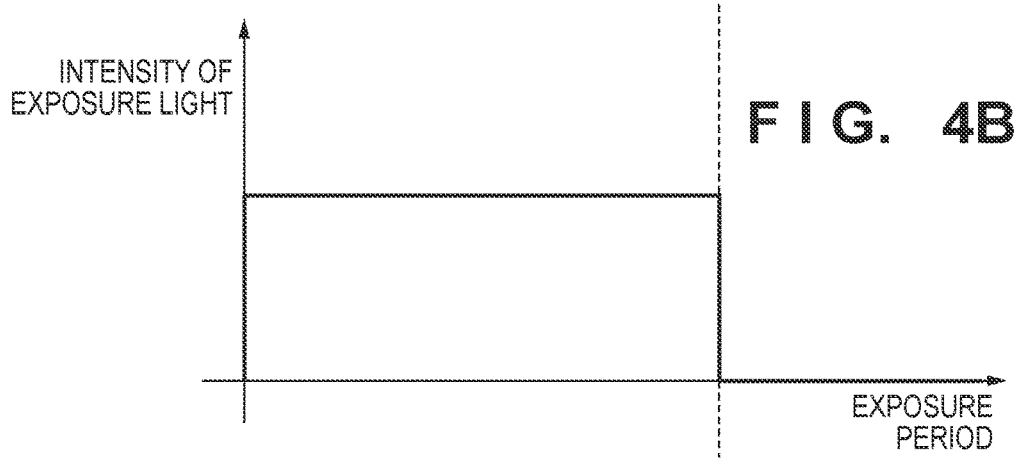
FIG. 4B is a graph showing the relationship between an exposure period and the intensity of exposure light, on the first exposure condition.

In step S15, based on an actually measured value (actually measured result) of the fluctuation in the optical characteristics obtained in the actual measurement step on the first exposure condition, the control unit 9 determines the first prediction formula such that the prediction value approaches the actually measured value. For example, based on the actually measured value of the fluctuation in the optical characteristics, the control unit 9 obtains the correction parameter (the coefficient Ic in the first embodiment) of the first prediction formula and determines the first prediction formula such that the predicted value approaches the actually measured value. Note that the control unit 9 may obtain the coefficient Ic of the first prediction formula based on the coefficient Ic of the second prediction formula corresponding to the second exposure condition selected in step S13-4 to be described later. In this case, the control unit 9 corrects the coefficient Ic of the second prediction formula such that each difference 12 between a predicted value 11 obtained by the second prediction formula and an actually measured value 13 of the fluctuation in the optical characteristics on the first exposure condition becomes small, as shown in FIG. 4A. Then, the control unit 9 can determine the first prediction formula by using the coefficient Ic of the corrected second prediction formula as the coefficient Ic of the first prediction formula. FIG. 4A is a graph showing the actually measured values 13 of the fluctuation in the optical characteristics on the first exposure condition and the predicted values 11 of the fluctuation in the optical characteristics obtained by the second prediction formula.

In step S16, the control unit 9 judges whether each difference between the predicted value and the actually measured value obtained by the first prediction formula determined in step S15 is equal to or lower than a threshold. If the control unit 9 judges that the difference is equal to or lower than the threshold, the process advances to step S17. If the control unit 9 judges that the difference exceeds the threshold, the process repeats step S15. In step S17, the control unit 9 starts the exposure process on the first exposure condition by using the determined first prediction formula.

[Judgment Method of Presence/Absence of Actual Measurement Step]

A method of judging whether the actual measurement step is needed when the first prediction formula corresponding to the first exposure condition is determined in step S13 will now be described. The control unit 9 can make the judgment in accordance with, for example, a flowchart shown in FIG. 5. FIG. 5 is the flowchart showing the method of judging whether the actual measurement step is needed when the first prediction formula corresponding to the first exposure condition is determined.

In step S13-1, the control unit 9 obtains information indicating the relationship between the correction parameter (coefficient Ic) of the prediction formula (second prediction formula) that has already been determined by undergoing the actual measurement step and the exposure condition (second exposure condition) corresponding to it. FIG. 6 is a table showing an example of the information indicating the relationship between the coefficient Ic of the second prediction formula and the second exposure condition corresponding to it. In the example shown in FIG. 6, the illumination NA, the illumination σ, and the exposure angle of view (the width of the angle of view and the height of the angle of view) are set as the items of the exposure condition, and the relationship between a value of each item for each of the plurality of second exposure conditions and the coefficient Ic corresponding to it is shown. The coefficient Ic as the correction parameter is set in FIG. 6. However, the present invention is not limited to this. For example, the time constant K or the like may be set. Further, when a formula different from formula (1) is used as a prediction formula, a parameter different from the coefficient Ic or the time constant K may be set.

In step S13-2, the control unit 9 obtains a sensitivity indicating a fluctuation rate of the optical characteristics relative to a change in the exposure condition for each item of the exposure condition. An example will be described here in which the sensitivity is obtained from a change rate of the coefficient Ic relative to the change in the exposure condition. First, a vector $p_k$ represents the kth item of the second exposure condition as given by:

$$p_k = (p_{k1}, p_{k2}, p_{k3} \cdots p_{kn}) \quad (2)$$

where an element $p_{ki}$ of the vector $p_k$ represents the ith item in the second exposure condition. For example, in the information shown in FIG. 6, elements $p_{k1}$ to $p_{k4}$ correspond to the illumination NA, the illumination σ, and the exposure angle of view (the width of the angle of view and the height of the angle of view), respectively. Similarly, a vector $p_t$ represents the item of the first exposure condition as given by:

$$p_t = (p_{t1}, p_{t2}, p_{t3} \cdots p_{tm}) \quad (3)$$

where an element $p_{ti}$ of the vector $p_t$ represents the ith item in the first exposure condition and is the same as the ith item in the second exposure condition. For example, in the information shown in FIG. 6, elements $p_{t1}$ to $p_{t4}$ correspond to the illumination NA, the illumination σ, and the exposure angle of view (the width of the angle of view and the height of the angle of view), respectively.

Next, a sensitivity c is obtained from the change rate of the coefficient Ic relative to the change in the exposure condition as given by:

$$c = \left(\frac{\partial I_c}{\partial p_1}, \frac{\partial I_c}{\partial p_2}, \frac{\partial I_c}{\partial p_3} \ldots \frac{\partial I_c}{\partial p_n}\right) = (c_1, c_2, c_3 \ldots c_n) \quad (4)$$

The change rate of the coefficient Ic relative to the change in the exposure condition can be obtained from the plurality of coefficients Ic obtained as a result of performing the actual measurement step a plurality of times by changing the exposure condition in advance. Alternatively, the sensitivity c may be obtained directly as a result of obtaining the fluctuation rate of the optical characteristics relative to the change in the exposure condition by a simulation such as a thermal structure analysis.

For example, from the relationship between each of the plurality of second exposure conditions and the coefficient Ic of the second prediction condition corresponding to it by using the information shown in FIG. 6, the sensitivity c can also be obtained by the least square method as given by:

$$c = \begin{pmatrix} c_0 \\ c_1 \\ c_2 \\ c_3 \\ c_4 \end{pmatrix} = \begin{pmatrix} -10.0 \\ 0.10 \\ 0.30 \\ 0.20 \\ 0.20 \end{pmatrix} \quad (6)$$

where each element $p_{ki}$ in an A matrix represents the ith item in the kth second exposure condition, and a vector b represents the coefficient Ic of the second prediction formula corresponding to the kth second exposure condition. A sensitivity $c_0$ corresponding to an offset of the coefficient Ic is added to the sensitivity c. The sensitivity c can be obtained as shown in formula (6) by applying the value of each item in the exposure condition in the information shown in FIG. 6 to:

$$A = \begin{pmatrix} 1 & p_{11} & p_{12} & \cdots & p_{1n} \\ 1 & p_{21} & \ddots & & \vdots \\ \vdots & \vdots & & p_{ki} & \\ 1 & p_{m1} & \cdots & & p_{mn} \end{pmatrix}, \quad (5)$$

$$c = \begin{pmatrix} c_0 \\ \vdots \\ c_i \\ \vdots \\ c_n \end{pmatrix},$$

$$b = \begin{pmatrix} Ic_0 \\ \vdots \\ Ic_k \\ \vdots \\ Ic_m \end{pmatrix}$$

$$c = A^{-1}b$$

Note that the A matrix does not become a regular matrix when the number of second exposure conditions and the number of items in the exposure condition are different from each other. Thus, the sensitivity c can be obtained by using a pseudo-inverse matrix such as singular value decomposition, as shown in formula (5). All the plurality of second exposure conditions need not be used when the sensitivity c is obtained from each relationship between the second exposure condition and the coefficient Ic in the second prediction formula corresponding to it. When a linear approximation is used, the second exposure condition close to the first exposure condition may be extracted from the plurality of second exposure conditions, and the sensitivity c may be obtained based on the extracted second exposure condition.

In step S13-3, the control unit 9 obtains the correlation coefficient between the first exposure condition and the second exposure condition with respect to each of the plurality of second exposure conditions. For example, the control unit 9 weights the difference for each item between the first exposure condition and the second exposure condition according to the sensitivity for each item of the exposure condition obtained in step S13-2, as given by:

$$x_k = (x_{k1}, x_{k2}, x_{k3} \ldots x_{kn}) = \quad (7)$$
$$(c_1(p_{k1} - p_{t1}), c_2(p_{k2} - p_{t2}), c_3(p_{k3} - p_{t3}) \ldots c_n(p_{kn} - p_{tn}))$$

A vector $x_k$ obtained by formula (7) can be regarded as position coordinates of the second exposure condition when position coordinates $x_t$ of the first exposure condition are set to the origin in a space where each item of the exposure condition is set to a coordinate axis. That is, if the number of items in the exposure condition is n, and the number of second exposure conditions is m, the position coordinates of each second exposure condition in the n-dimensional space are represented by $x_1$ to $x_m$, respectively.

Then, the control unit 9 obtains, from a total sum (square sum) of the respective values obtained by formula (7), the correlation coefficient by using:

$$d_k = \|x_k\| = \sqrt{\sum_{i=1}^{n} (c_i(p_{ki} - p_{ti}))^2} \quad (8)$$

In the first embodiment, a distance $d_k$ between the first exposure condition and the second exposure condition in the space where each item of the exposure condition is set to the coordinate axis can be used as the correlation coefficient between the first exposure condition and the second exposure condition. Applying the value of each item of the exposure condition in the information shown in FIG. 6 to formula (8), the distance $d_k$ on each second exposure condition can be obtained as given by:

$$\begin{pmatrix} d_1 \\ d_2 \\ d_3 \\ d_4 \\ d_5 \\ d_6 \end{pmatrix} = \begin{pmatrix} 0.80 \\ 1.02 \\ 0.41 \\ 1.17 \\ 1.00 \\ 0.64 \end{pmatrix} \quad (9)$$

Figure 7:
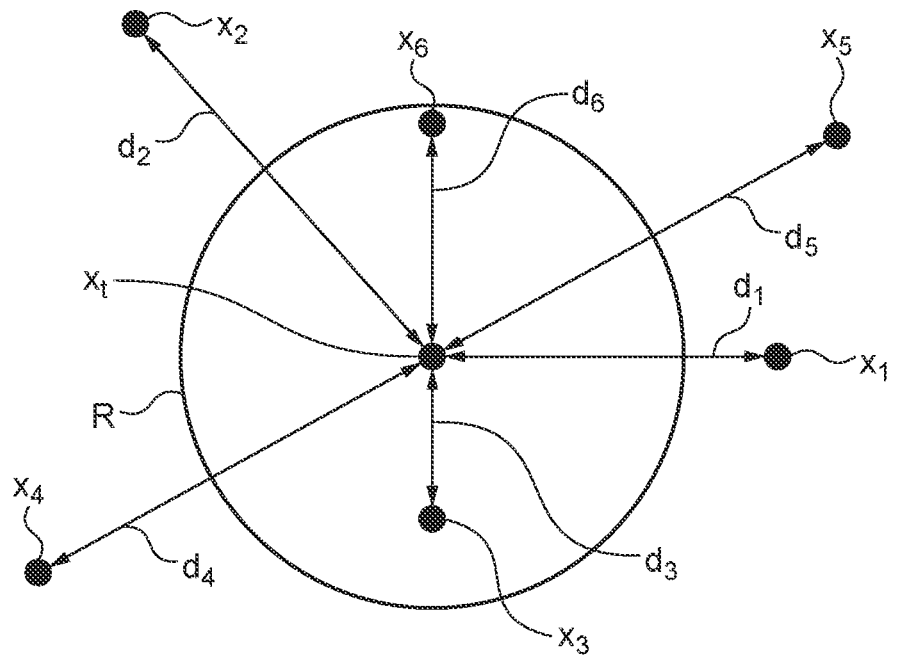
FIG. 7 is a conceptual view for explaining the distance between the first exposure condition and the second exposure conditions.

FIG. 7 is a conceptual view for explaining the distance $d_k$ between the first exposure condition (position coordinates $x_t$) and the second exposure condition (position coordinates $x_k$). When the distance $d_k$ between the first exposure condition and the second exposure condition is used as the correlation coefficient as described above, the correlativity between the first exposure condition and the second exposure condition can be regarded as higher as the distance $d_k$ is shorter.

In step S13-4, the control unit 9 selects, out of the plurality of second exposure conditions, the second exposure condition having the shortest distance $d_k$, that is, the second exposure condition having the highest correlation coefficient. For example, in the information shown in FIG. 6, out of distances $d_1$ to $d_6$ corresponding to the plurality of second exposure conditions (conditions 1 to 6 ($x_1$ to $x_6$)), the distance $d_3$ corresponding to the third second exposure condition (condition 3 ($x_3$)) is the shortest, as shown in FIG. 7. Thus, the control unit 9 selects the third second exposure condition as the second exposure condition having the highest correlation coefficient to the first exposure condition.

In step S13-5, the control unit 9 determines whether the correlation coefficient (distance $d_k$) between the first exposure condition and the second exposure condition selected in step S13-4 falls within an allowable range R. If the control unit 9 determines that the correlation coefficient falls within the allowable range, the process advances to step S13-6, and advances to step S13-7 after the control unit 9 judges that the actual measurement step is not needed to determine the first prediction formula in step S13-6. On the other hand, if the control unit 9 determines that the correlation coefficient falls outside the allowable range, the process advances to step S13-8, and advances to step S14 of FIG. 3 after the control unit 9 judges that the actual measurement step is needed to determine the first prediction formula in step S13-8.

In step S13-7, the control unit 9 determines the first prediction formula based on the second prediction formula corresponding to the second exposure condition selected in step S13-4 without actually measuring the fluctuation in the optical characteristics of the projection optical system while the substrate 4 is exposed on the first exposure condition. The control unit 9 can determine the first prediction formula based on, for example, the difference between the first exposure condition and the second exposure condition selected in step S13-4, and the second prediction formula corresponding to the second exposure condition. More specifically, based on the difference between the first exposure condition and the second exposure condition selected in step S13-4, and a coefficient $Ic_k$ of the second prediction formula corresponding to the second exposure condition, the control unit 9 can obtain a coefficient $Ic_t$ of the first prediction formula by using:

$$Ic_t = Ic_k + c \cdot (p_k - p_t)^T = Ic_k + \sum_{i=1}^{n} c_i(p_{ki} - p_{ti}) \quad (10)$$

where "k" represents the number of the second exposure condition selected in step S13-4.

In the information shown in FIG. 6, the third second exposure condition (condition 3) has the highest correlation coefficient to the first exposure condition. Therefore, the control unit 9 obtains the coefficient $Ic_t$ of the first prediction formula by substituting the coefficient $Ic_k$ (k=3) of the second prediction formula corresponding to the third second exposure condition into formula (10). The control unit 9 can determine the first prediction formula by thus obtaining the coefficient $Ic_t$ of the first prediction formula. After determining the first prediction formula, the process advances to step S17 of FIG. 3, and the control unit 9 starts the exposure process by using the determined first prediction formula. In the first embodiment, the coefficient $Ic_t$ of the first prediction formula is obtained by substituting the coefficient $Ic_k$ of the second prediction formula corresponding to the second exposure condition selected in step S13-4 into formula (10), determining the first prediction formula in step S13-7. However, the present invention is not limited to this. For example, the second prediction formula corresponding to the second exposure condition selected in step S13-4 may be applied, without any change, as the first prediction formula.

Note that using a value obtained by multiplying a difference $(p_k - p_t)$ for each item between the first exposure condition and the second exposure condition by the sensitivity c as a linear coefficient, as shown in formula (10), as a method of obtaining the coefficient $Ic_t$ of the first prediction formula from the difference is merely an example. For example, a coefficient of a nonlinear component of the second order or more may be used when the coefficient $Ic_t$ of the first prediction formula nonlinearly changes with respect to each item of the exposure condition.

If the control unit 9 judges that the actual measurement step is needed to determine the first prediction formula (step S13-8), the contents of the actual measurement step may be changed in accordance with the correlation coefficient between the first exposure condition and the second exposure condition selected in step S13-4. For example, if the correlation coefficient between the first exposure condition and the second exposure condition selected in step S13-4 is high to some extent, a fluctuation tendency of the optical characteristics on the first exposure condition can be predicted from a result of actually measuring the fluctuation in the optical characteristics on the second exposure condition. Thus, the contents of the actual measurement step may be changed by, for example, reducing an actually measured period in accordance with the correlation coefficient to the extent that an offset amount of the fluctuation in the optical characteristics on the first exposure condition can be obtained.

As described above, the exposure apparatus 10 of the first embodiment obtains the correlation coefficient between the first exposure condition and the second exposure condition. When the correlation coefficient falls within the allowable range, the first prediction formula for predicting the fluctuation in the optical characteristics on the first exposure condition is determined, without performing the actual measurement step on the first exposure condition, based on the second prediction formula corresponding to the second exposure condition. That is, when the correlation coefficient falls within the allowable range, it is possible to omit the actual measurement step on the first exposure condition and simplify the determination of the first prediction formula corresponding to the first exposure condition.

Note that a timing to start a step of judging whether the actual measurement step is needed is not limited to immediately after a user changes the exposure condition. For example, the step may be started automatically by the control unit 9 when the exposure condition is changed or may be started at an arbitrary timing by the user using a command or the like. When judging whether the actual measurement step is needed, the control unit 9 may cause a display unit such as a display to display the correlation coefficient between the first exposure condition and the second exposure condition. The control unit 9 may also cause the display unit to display the second exposure condition having the highest correlation coefficient to the first exposure condition.

The information shown in FIG. 6 is merely an example showing the items of the exposure condition and the coefficient Ic of the prediction formula corresponding to the exposure condition. The information may be, for example, a vector of each item, map display of each item, or function approximations of the items. A mode when the information shown in FIG. 6 is saved may be not only a recipe but also a file (including a log) or a database. A save destination of the information is not limited to the control unit 9 of the exposure apparatus 10 but may be, for example, the computer outside the exposure apparatus 10. The information shown in FIG. 6 may not be obtained from the single exposure apparatus 10. For example, information on the exposure condition is moved onto a server from the plurality of exposure apparatuses 10 set in the same factory, and the information may be shared among the plurality of exposure apparatuses.

Second Embodiment

In the first embodiment, the example has been described in which the sensitivity c is obtained from the change rate of the coefficient Ic relative to the change in the exposure condition. In a prediction formula for predicting optical characteristics of a projection optical system 3, however, not only one coefficient Ic but also a plurality of coefficients may be included as correction parameters. In this case, a sensitivity c may be obtained from a change rate of each of the plurality of coefficients, and a correlation coefficient between the first exposure condition and the second exposure condition may be obtained from the obtained sensitivity c. For example, a case is assumed in which a plurality of coefficients $Ic_1, Ic_2, \ldots, Ic_j$ are included in the prediction formula. In this case, a sensitivity $c_j$ to the jth coefficient $Ic_j$ can be given by:

$$c = \left( \frac{\partial I_{cj}}{\partial p_1}, \frac{\partial I_{cj}}{\partial p_2}, \frac{\partial I_{cj}}{\partial p_3} \cdots \frac{\partial I_{cj}}{\partial p_n} \right) = (c_{j1}, c_{j2}, c_{j3} \ldots c_{jn}) \quad (11)$$

A distance $d_{jk}$ with respect to the jth coefficient $Ic_j$ can be given by:

$$d_{jk} = \|x_{jk}\| = \sqrt{\sum_{i=1}^{n} (c_{ji}(p_{ki} - p_{ti}))^2} \quad (12)$$

A total value $d_k$ of the distance $d_{jk}$ with respect to the first to the jth coefficients is obtained by:

$$d_k = \sum_j d_{jk} \quad (13)$$

The total value $d_k$ is used as the correlation coefficient between the first exposure condition and the second exposure condition. When the total value $d_k$ is used as the correlation coefficient as described above, the correlativity between the first exposure condition and the second exposure condition can be regarded as higher as the distance $d_k$ is shorter.

<Embodiment of Article Manufacturing Method>

An article manufacturing method according to an embodiment of the present invention is suitable to manufacture an article, for example, a microdevice such as a semiconductor device or an element having a microstructure. The article manufacturing method according to this embodiment includes a step of forming a latent image pattern on a photoresist applied to a substrate using the above-described exposure apparatus (a step of exposing a substrate), and a step of developing the substrate with the latent image pattern formed in the step. The manufacturing method further includes other known steps (oxidation, deposition, vapor deposition, doping, planarization, etching, resist removal, dicing, bonding, and packaging). The article manufacturing method according to this embodiment is superior to a conventional method in at least one of the performance, quality, productivity, and production cost of the article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-163092 filed on Aug. 20, 2015, which is hereby incorporated by reference herein in its entirety.

What is claimed is:

1. A determination method of determining a first prediction formula for predicting a fluctuation in optical characteristics of a projection optical system while a substrate is exposed on a first exposure condition, the method comprising:

an obtaining step of obtaining a correlation coefficient between the first exposure condition and a second exposure condition corresponding to a second prediction formula for predicting the fluctuation in the optical characteristics; and a first determining step of determining, in a case where the correlation coefficient falls within an allowable range, the first prediction formula based on the second prediction formula and a difference between the first exposure condition and the second exposure condition.

2. The method according to claim 1, further comprising a second determining step of, before the first obtaining step, determining the second prediction formula based on a result of actually measuring the fluctuation in the optical characteristics while the substrate is exposed on the second exposure condition.

3. The method according to claim 1, wherein:
the obtaining step obtains the correlation coefficient between the first exposure condition and each of a plurality of ones of the second exposure condition, and
the first determining step determines the first prediction formula based on the second prediction formula corresponding to, among the plurality of ones of the second exposure condition, a second exposure condition with the correlation coefficient falling within the allowable range and being the highest, and the difference between the first exposure condition and the second exposure condition.

4. The method according to claim 1, wherein:
each of the first prediction formula and the second prediction formula includes a coefficient for making a predicted value closer to an actually measured value, and
the first determining step determines the coefficient of the first prediction formula based on the coefficient of the second prediction formula and the difference between the first exposure condition and the second exposure condition.

5. The method according to claim 4, wherein the first determining step:
obtains a sensitivity indicating a fluctuation rate of the optical characteristics relative to a change in an exposure condition for each item of the exposure condition,
obtains a total sum of values obtained by weighting a difference for each item between the first exposure condition and the second exposure condition according to the sensitivity, and
determines the coefficient of the first prediction formula using the total sum and the coefficient of the second prediction formula.

6. The method according to claim 1, wherein the first determining step applies the second prediction formula as the first prediction formula.

7. The method according to claim 1, wherein the obtaining step:
obtains a sensitivity indicating a fluctuation rate in the optical characteristics relative to a change in an exposure condition for each item of the exposure condition, and
obtains the correlation coefficient using a square sum of values obtained by weighting a difference for each item between the first exposure condition and the second exposure condition according to the sensitivity.

8. The method according to claim 1, wherein each of the first exposure condition and the second exposure condition includes at least one item of illumination NA, illumination σ, or an exposure angle of view.

9. A non-transitory computer-readable storage medium storing a program executable by a computer to execute a determination method of determining a first prediction formula for predicting a fluctuation in optical characteristics of a projection optical system while a substrate is exposed on a first exposure condition, the method comprising:
an obtaining step of obtaining a correlation coefficient between the first exposure condition and a second exposure condition corresponding to a second prediction formula for predicting the fluctuation in the optical characteristics; and
a determining step of determining, in a case where the correlation coefficient falls within an allowable range, the first prediction formula based on the second prediction formula and a difference between the first exposure condition and the second exposure condition.

10. An exposure apparatus for exposing a substrate via a projection optical system, the exposure apparatus comprising:
a change unit configured to change optical characteristics of the projection optical system; and
a control unit configured to determine a first prediction formula for predicting a fluctuation in the optical characteristics of the projection optical system while the substrate is exposed on a first exposure condition and control the change unit based on a predicted value obtained by the first prediction formula,
wherein the control unit:
obtains a correlation coefficient between the first exposure condition and a second exposure condition corresponding to a second prediction formula for predicting the fluctuation in the optical characteristics; and
determines, in a case where the correlation coefficient falls within an allowable range, the first prediction formula based on the second prediction formula and a difference between the first exposure condition and the second exposure condition.

11. A method of manufacturing an article, the method comprising the steps of:
exposing a substrate using an exposure apparatus;
developing the exposed substrate; and
processing the developed substrate to manufacture the article,
wherein the exposure apparatus exposes the substrate via a projection optical system, and includes:
a change unit configured to change optical characteristics of the projection optical system; and
a control unit configured to determine a first prediction formula for predicting a fluctuation in the optical characteristics of the projection optical system while the substrate is exposed on a first exposure condition and control the change unit based on a predicted value obtained by the first prediction formula,
wherein the control unit:
obtains a correlation coefficient between the first exposure condition and a second exposure condition corresponding to a second prediction formula for predicting the fluctuation in the optical characteristics; and
determines, in a case where the correlation coefficient falls within an allowable range, the first prediction formula based on the second prediction formula and a difference between the first exposure condition and the second exposure condition.

12. The method according to claim 1, wherein the obtaining step obtains the correlation coefficient based on the difference between the first exposure condition and the second exposure condition obtained for each item of an exposure condition.

13. The method according to claim 1, wherein the first determining step determines the first prediction formula without actually measuring the fluctuation in the optical characteristics while the substrate is exposed on the first exposure condition.

14. The method according to claim 1, further comprising a second determining step of, in a case where the correlation coefficient falls outside the allowable range, the first prediction formula based on a result of actually measuring the fluctuation in the optical characteristics while the substrate is exposed on the first exposure condition.

15. The method according to claim 14, wherein in the second determining step, contents for the actually measuring the fluctuation in the optical characteristics are changed in accordance with the correlation coefficient.

16. A determination method of determining a first prediction formula for predicting a fluctuation in optical characteristics of a projection optical system while a substrate is exposed on a first exposure condition, the method comprising:
    an obtaining step of obtaining a correlation coefficient between the first exposure condition and a second exposure condition corresponding to a second prediction formula for predicting the fluctuation in the optical characteristics; and
    a first determining step of determining, in a case where the correlation coefficient falls within an allowable range, the first prediction formula based on the second prediction formula and a difference between the first exposure condition and the second exposure condition, wherein in the obtaining step:
        obtains a sensitivity indicating a fluctuation rate in the optical characteristics relative to a change in an exposure condition for each item of the exposure condition; and
        obtains the correlation coefficient using a square sum of values obtained by weighting a difference for each item between the first exposure condition and the second exposure condition according to the sensitivity.

17. The method according to claim 16, wherein in the first determining step determines the first prediction formula without actually measuring the fluctuation in the optical characteristics while the substrate is exposed on the first exposure condition.

18. The method according to claim 16, further comprising a second determining step of determining, in a case where the correlation coefficient falls outside the allowable range, the first prediction formula based on a result of actually measuring the fluctuation in the optical characteristics while the substrate is exposed on the first exposure condition.

* * * * *